(12) United States Patent
Okinaka et al.

(10) Patent No.: US 8,227,094 B2
(45) Date of Patent: Jul. 24, 2012

(54) ORGANIC ELECTROLUMINESCENT DEVICE

(75) Inventors: Keiji Okinaka, Kawasaki (JP);
Masataka Yashima, Tokyo (JP);
Akihito Saitoh, Yokohama (JP); Naoki Yamada, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 891 days.

(21) Appl. No.: 12/103,162

(22) Filed: Apr. 15, 2008

(65) Prior Publication Data

US 2008/0268285 A1 Oct. 30, 2008

(30) Foreign Application Priority Data

Apr. 27, 2007 (JP) .................................. 2007-118405
Mar. 14, 2008 (JP) .................................. 2008-065788

(51) Int. Cl.
*H01L 51/54* (2006.01)

(52) U.S. Cl. ......... 428/690; 428/917; 313/504; 313/506

(58) Field of Classification Search ........................ None
See application file for complete search history.

(56) References Cited

U.S. PATENT DOCUMENTS

| | | | | |
|---|---|---|---|---|
| 6,358,633 | B1 * | 3/2002 | Sano et al. ..................... | 428/690 |
| 7,255,938 | B2 | 8/2007 | Hamada et al. ................ | 428/690 |
| 2004/0076853 | A1 * | 4/2004 | Jarikov ......................... | 428/690 |
| 2004/0253389 | A1 * | 12/2004 | Suzuki et al. .................. | 428/1.1 |
| 2004/0265632 | A1 | 12/2004 | Okinaka et al. ............... | 428/690 |
| 2006/0017376 | A1 | 1/2006 | Okinaka et al. ............... | 313/504 |
| 2006/0040131 | A1 * | 2/2006 | Klubek et al. ................. | 428/690 |
| 2006/0052641 | A1 * | 3/2006 | Funahashi ..................... | 564/426 |
| 2006/0158102 | A1 | 7/2006 | Kawamura et al. ........... | 313/504 |
| 2007/0075635 | A1 * | 4/2007 | Yabunouchi et al. ......... | 313/506 |
| 2007/0111029 | A1 | 5/2007 | Yamada et al. ............... | 428/690 |
| 2007/0155998 | A1 * | 7/2007 | Saitoh et al. .................... | 585/26 |
| 2007/0205713 | A1 | 9/2007 | Okinaka et al. ............... | 313/504 |
| 2007/0228399 | A1 * | 10/2007 | Iwawaki et al. ................. | 257/89 |
| 2007/0249878 | A1 * | 10/2007 | Iwawaki et al. ................. | 585/27 |
| 2007/0272921 | A1 * | 11/2007 | Furugori ......................... | 257/40 |
| 2007/0278938 | A1 * | 12/2007 | Yabunouchi et al. ......... | 313/504 |
| 2008/0124577 | A1 * | 5/2008 | Saitoh et al. ................... | 428/704 |
| 2009/0066227 | A1 * | 3/2009 | Okinaka et al. ............... | 313/504 |

FOREIGN PATENT DOCUMENTS

| | | | |
|---|---|---|---|
| JP | 2002-069044 | * | 3/2002 |
| JP | 2005-108726 | | 4/2005 |
| JP | 2006-156888 | | 6/2006 |

* cited by examiner

*Primary Examiner* — Dawn L. Garrett
(74) *Attorney, Agent, or Firm* — Fitzpatrick, Cella, Harper & Scinto

(57) ABSTRACT

Provided is an organic electroluminescent device for emitting blue light, which has high luminous efficiency and good drive durability. This organic electroluminescent device for emitting blue light includes an anode 2, a cathode 6, and a layer which contains an organic compound interposed between the anode 2 and the cathode 6, the layer which contains an organic compound including at least a light-emitting layer 4, wherein the light-emitting layer 4 contains a bipolar host having a hole mobility and an electron mobility of $10^{-4}$ cm$^2$/Vs or greater, a light-emitting dopant and a carrier trapping dopant, and the light-emitting dopant energy gap $E_{gB}$, the bipolar host energy gap $E_{gh}$, and the carrier trapping dopant energy gap $E_{gd}$ are such that $E_{gd} > E_{gh} > E_{gB}$.

12 Claims, 4 Drawing Sheets

(a) ENERGY TRANSFER
(b) DIRECT RECOMBINATION (a) ENERGY TRANSFER
(b) DIRECT RECOMBINATION (a) ENERGY TRANSFER
(b) DIRECT RECOMBINATION

ORGANIC ELECTROLUMINESCENT DEVICE

BACKGROUND OF THE INVENTION

1. Field of the Invention

The present invention relates to an organic electroluminescent device.

2. Description of the Related Art

Organic electroluminescent devices are provided with a thin film containing a light-emitting organic compound between an anode and a cathode. By injecting holes and electrons from the respective electrodes, excitons of the light-emitting organic compound are generated. When these excitons return to a ground state, the organic electroluminescent devices irradiate light.

Recent developments in organic electroluminescent devices have been very significant. Characteristic examples of such developments include high brightness at low applied voltages, more diversity in emission wavelengths, rapid response, and the ability to produce thinner and lighter light-emitting devices. As a result of these developments, a broad range of possible applications are being suggested for organic electroluminescent devices.

However, especially when considering applications in full color displays, present devices do not have sufficient luminous efficiency or stability for practical use. Especially for blue-light-emitting devices, there is a need for further improvements in performance.

Regarding improving the stability of organic electroluminescent devices, for example, Japanese Patent Application Laid-Open No. 2005-108726 describes a device which is characterized by containing an electron mobile host as a blue-light-emitting layer, a hole mobile material as an assist dopant, and also a light-emitting dopant. Further, Japanese Patent Application Laid-Open No. 2006-156888 describes an example in which, as the light-emitting layer, an electron trapping dopant and a hole trapping dopant, which have a smaller energy gap than the host material, are mixed in an anthracene host material.

In conventional blue-light-emitting devices, the recombination probability of the holes and the electrons in the light-emitting layer, charge trapping, and the expansion of the emission region in the light-emitting layer are insufficient, whereby sufficient luminous efficiency and drive durability could not be obtained. Further, the energy transfer efficiency of the light-emitting dopant for conventional blue-light-emitting devices has been insufficient, so that there have been problems with the emitted color and luminous efficiency.

SUMMARY OF THE INVENTION

The present inventors completed the present invention as a result of extensive investigation to resolve the above-described problems.

Specifically, provided is an organic electroluminescent device for emitting blue light, comprising an anode, a cathode and a layer which comprises an organic compound interposed between the anode and the cathode, the layer which comprises an organic compound including at least a light-emitting layer, wherein the light-emitting layer comprises a bipolar host having a hole mobility and an electron mobility of $10^{-4}$ cm$^2$/Vs or greater, a light-emitting dopant and a carrier trapping dopant, and the light-emitting dopant energy gap $E_{gB}$, the bipolar host energy gap $E_{gh}$, and the carrier trapping dopant energy gap $E_{gd}$ are such that $E_{gd} > E_{gh} > E_{gB}$.

According to the present invention, an organic electroluminescent device for emitting blue light can be obtained which has high luminous efficiency and good continuous drive durability.

Further features of the present invention will become apparent from the following description of exemplary embodiments with reference to the attached drawings.

DESCRIPTION OF THE EMBODIMENTS

First, the organic electroluminescent device according to the present invention will be described. The organic electroluminescent device according to the present invention has an anode, a cathode, and a layer which comprises an organic compound interposed between the anode and the cathode. This layer which comprises an organic compound includes at least a light-emitting layer which emits blue light. Hereinafter, the organic electroluminescent device according to the present invention will be described with reference to the drawings.

Figure 1:
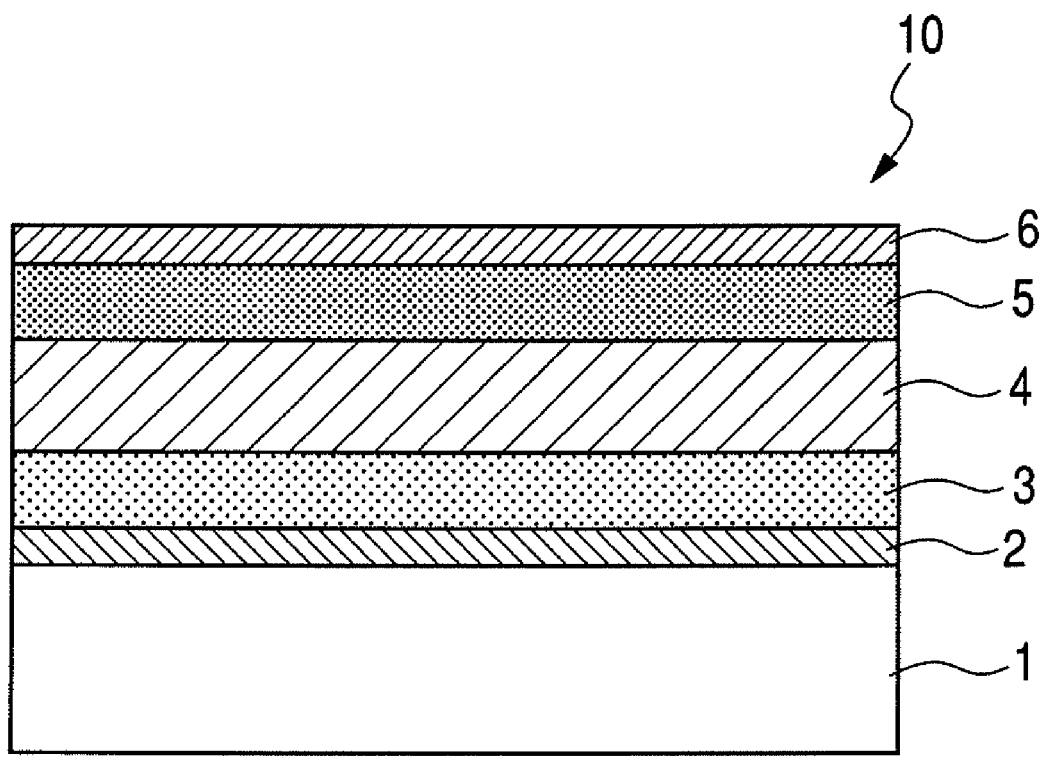
FIG. 1 is a cross-sectional view illustrating one embodiment of the organic electroluminescent device according to the present invention.

FIG. 1 is a cross-sectional view illustrating one embodiment of the organic electroluminescent device according to the present invention. The organic electroluminescent device 10 of FIG. 1 is provided with, on a substrate 1, an anode 2, a hole transport layer 3, a light-emitting layer 4, an electron transport layer 5, and a cathode 6 in that order.

The organic electroluminescent device according to the present invention is not limited to this embodiment. For example, to increase the hole injection properties from the anode 2, a hole injection layer may optionally be inserted between the anode 2 and the hole transport layer 3. Similarly, an electron injection layer may be inserted between the cathode 6 and the electron transport layer 5. Further, to effectively trap the holes in the light-emitting layer 4, a hole blocking layer can be provided between the light-emitting layer 4 and the electron transport layer 5. Similarly, to effectively trap the electrons in the light-emitting layer 4, an electron blocking layer can optionally be provided between the light-emitting layer 4 and the hole transport layer 3.

Further, the light-emitting layer 4 can be used to adjust the emitted color or to improve luminous efficiency by mixing a light-emitting dopant material in the host material.

To prevent the carriers from leaking, a material having an energy gap wider than the light-emitting layer material can be used for the transport layers, such as the hole transport layer 3, electron transport layer 5, the hole blocking layer and the electron blocking layer. Therefore, for a blue-light-emitting organic electroluminescent device, although ideally a very wide energy gap (e.g., 3.4 eV or greater) can be used, it generally becomes difficult to combine film-forming properties together with heat resistance. Thus, materials which have a gap slightly wider than the light-emitting layer material are usually used for the transport layer material, which means that it is especially important to make the hole and electrons recombine efficiently in the light-emitting layer.

In the organic electroluminescent device according to the present invention, the light-emitting layer 4 is formed from a bipolar host, a light-emitting dopant, and a carrier trapping dopant. Here, "bipolar host" refers to a host material in which both the hole mobility and the electron mobility are $10^{-4}$ cm$^2$/Vs or greater. If both the hole mobility and the electron mobility are $10^{-4}$ cm$^2$/Vs or greater, the probability of the holes and the electrons recombining in the light-emitting layer 4 increases.

Further, "light-emitting dopant" and "carrier trapping dopant" refer to dopants which can make both the hole mobility and the electron mobility 1/10 or lower that of the bipolar host. By including these dopants in the light-emitting layer 4, the charge trapping effect in the light-emitting layer 9 increases.

The energy gap $E_{gB}$ of the light-emitting dopant must be smaller than the energy gap $E_{gh}$ of the bipolar host and the energy gap $E_{gd}$ of the carrier trapping dopant. This is an essential condition for the light-emitting dopant to emit light in the light-emitting layer.

In blue light emission, due to the above-described restrictions on the energy gap of the transports layers, the difference between $E_{gh}$ and $E_{gB}$ cannot be enlarged. This is because although it is desirable for $E_{gh}$ to be smaller than the energy gap of the transport layers, $E_{gh}$ has to be greater than $E_{gB}$.

In the present invention, the energy gap $E_{gd}$ of the carrier trapping dopant must be greater than $E_{gh}$. Specifically, $E_{gd} > E_{gh} > E_{gB}$.

If it is smaller (i.e., $E_{gh} > E_{gd} > E_{gB}$) problems occur such as a reduction in luminous efficiency and a decrease in the color purity of the emitted color. This is due to the following reasons.

Since $E_{gh} > E_{gd}$, excitons (excited state) of the carrier trapping dopant are produced by energy transfer from the bipolar host or direct recombination. Many of these excitons cannot transfer energy to the light-emitting dopant, and are deactivated as is while emitting light or not emitting light. This is because, in the case of blue light emission, for the reasons described above $E_{gd}$ and $E_{gB}$ have to take the closet value, which means that a sufficient energy transfer velocity cannot be attained among the weak concentration dopant. As a result, luminous efficiency is reduced, so that part of the carrier trapping dopant also lights up simultaneously with the light-emitting dopant, whereby the line width of the emission spectrum widens.

Here, examples of the bipolar host include fused polycyclic compounds. The bipolar host can be a fused non-heteropolycyclic aromatic compound containing a pyrene skeleton. On the other hand, hetero compounds do not easily become bipolar, and are thus not suitable as the bipolar host.

Further, anthracene derivatives, which have conventionally been used for the host of blue-light-emitting organic electroluminescent devices, have a slow hole mobility, and are thus not suitable as the bipolar host of the present invention. For example, Japanese Patent Application Laid-Open No. 2005-108726 describes that the anthracene derivative host material DNA has a hole mobility of $10^{-7}$ cm$^2$/Vs.

In the organic electroluminescent device according to the present invention, the fused non-heteropolycyclic aromatic compound used as the bipolar host can be a compound represented by the following general formula [1].

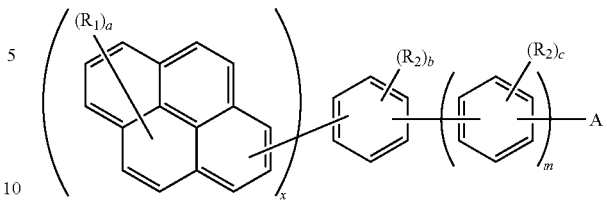

[1]

In formula [1], $R_1$ and $R_2$ respectively represent a substituted or unsubstituted alkyl group or a substituted or unsubstituted aryl group.

Examples of the alkyl group represented by $R_1$ and $R_2$ include a methyl group, an ethyl group, an n-propyl group, an n-butyl group, an n-pentyl group, an n-hexyl group, an n-heptyl group, an n-octyl group, an n-decyl group, an iso-propyl group, an iso-butyl group, a sec-butyl group, a tert-butyl group, an iso-pentyl group, a neopentyl group, a tert-octyl group, a fluoromethyl group, a difluoromethyl group, a trifluoromethyl group, a 2-fluoroethyl group, a 2,2,2-trifluoroethyl group, a perfluoroethyl group, a 3-fluoropropyl group, a perfluoropropyl group, a 4-fluorobutyl group, a perfluorobutyl group, a 5-fluoropentyl group, a 6-fluorohexyl group, a chloromethyl group, a trichloromethyl group, a 2-chloroethyl group, a 2,2,2-trichloroethyl group, a 4-chlorobutyl group, a 5-chloropentyl group, a 6-chlorohexyl group, a bromomethyl group, a 2-bromoethyl group, an iodomethyl group, a 2-iodoethyl group, a hydroxymethyl group, a hydroxyethyl group, a cyclopropyl group, a cyclobutyl group, a cyclopentyl group, a cyclohexyl group, a cyclopentylmethyl group, a cyclohexylmethyl group, a cyclohexylethyl group, a 4-fluorocyclohexyl group, a norbornyl group, an adamantyl group and the like.

Examples of the aryl group represented by $R_1$ and $R_2$ include a phenyl group, a 4-methylphenyl group, a 4-methoxyphenyl group, a 4-ethylphenyl group, a 4-fluorophenyl group, a 4-trifluorophenyl group, a 3,5-dimethylphenyl group, a 2,6-diethylphenyl group, a mesityl group, a 4-tert-butylphenyl group, a biphenyl group, a terphenyl group, a phenanthryl group, a pyrenyl group, a fluorenyl group and the like.

Examples of the substituents that the above-described alkyl group and aryl group may have include an alkyl group such as a methyl group, an ethyl group, a propyl group and a tert-butyl group; an aryl group such as a phenyl group, a biphenyl group and a fluoranthenyl group; an alkoxy group such as a methoxy group and an ethoxy group; a halogen atom such as fluorine, chlorine, bromine and iodine, and the like.

In formula [1], A represents a hydrogen atom, a substituted or unsubstituted alkyl group or a substituted or unsubstituted aryl group. Specific examples of the alkyl group, aryl group and the alkyl group and aryl group which may have a substituent are the same as the above-described specific examples mentioned for $R_1$ and $R_2$.

In formula [1], x denotes an integer from 1 to 6.
In formula [1], m denotes an integer from 0 to 10.
In formula [1], a denotes an integer from 0 to 8. When a is 2 or greater, each of the $R_1$s may be the same or different; and adjacent substituents may be linked together to form a ring.

In formula [1], b denotes an integer from 0 to 4; c denotes an integer from 0 to 4; when either of b or c is 2 or greater, each of the $R_2$s may be the same or different; and adjacent substituents may be linked together to form a ring.

Examples of the fused non-heteropolycyclic aromatic compound as the bipolar host include, but are not limited to, compounds represented by the following structural formulae.

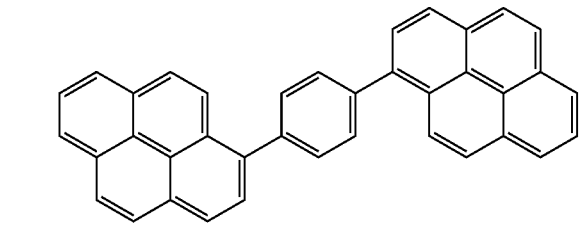

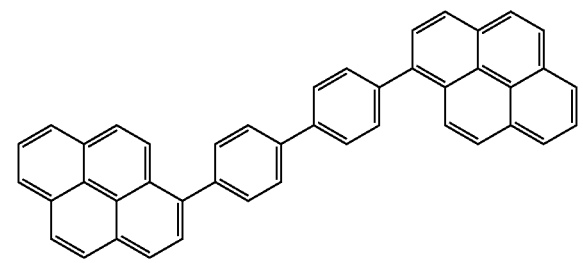

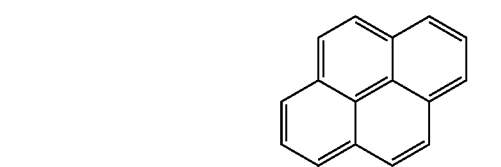

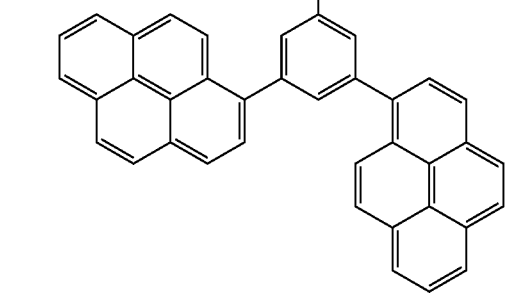

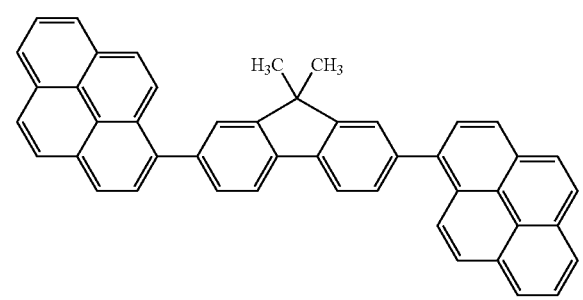

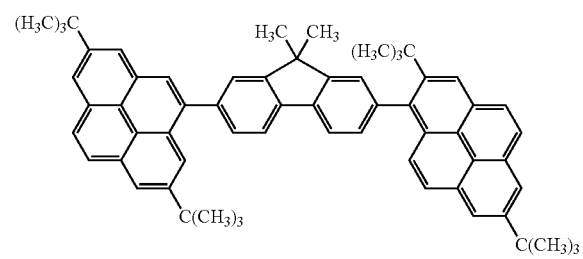

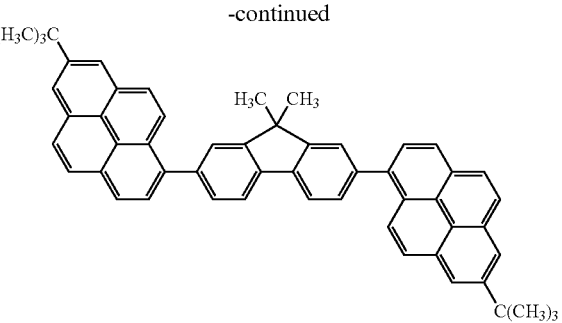

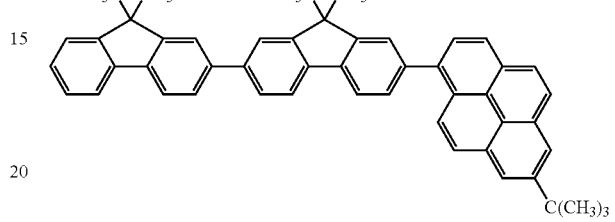

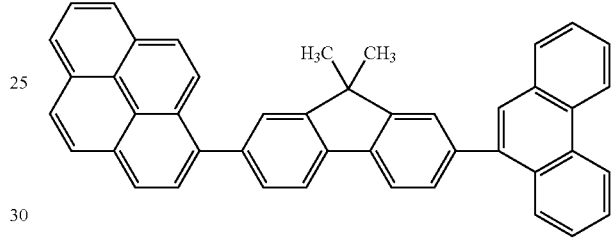

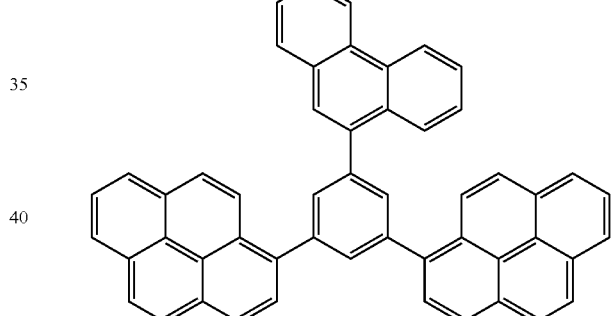

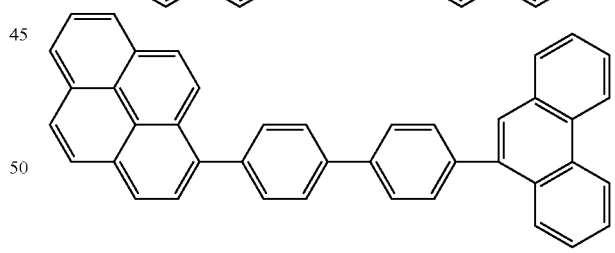

The term "carrier trapping dopant" refers to a dopant which can control the charge mobility of the light-emitting layer by being doped in the bipolar host. Hereinafter, a dopant which controls the mobility of the holes, and renders the hole mobility of the light-emitting layer 1/10 or lower that of the bipolar host by itself is referred to as a "hole trapping dopant". Further, a dopant which controls the mobility of the electrons, and renders the electron mobility of the light-emitting layer 1/10 or lower that of the bipolar host by itself is referred to as an "electron trapping dopant".

For the organic electroluminescent device according to the present invention, both a hole trapping dopant and an electron trapping dopant must be contained in the light-emitting layer 4. Either the hole trapping dopant or the electron trapping dopant also acts as the light-emitting dopant.

The hole trapping dopant is not especially limited so long as it is a material which decreases the hole mobility of the bipolar host to 1/10 or lower. From the perspective of energy levels, the hole trapping dopant desirably has an energy difference $\Delta E_H$ between the hole trapping dopant HOMO and the bipolar host HOMO of 0.15 eV or greater, and more desirably, 0.2 eV or greater. By providing such an energy difference, the hole mobility of the light-emitting layer 4 can be made 1/10 or lower that of the bipolar host.

The electron trapping dopant is not especially limited so long as it is a material which decreases the electron mobility of the bipolar host to 1/10 or lower. From the perspective of energy levels, the electron trapping dopant desirably has an energy difference $\Delta E_L$ between the electron trapping dopant LUMO and the bipolar host LUMO of 0.15 eV or greater, and more desirably, 0.2 eV or greater. By providing such an energy difference, the electron mobility of the light-emitting layer 4 can be made 1/10 or lower that of the bipolar host.

The organic electroluminescent device according to the present invention desirably has a light-emitting layer 4 hole mobility or electron mobility of $10^{-5}$ cm$^2$/Vs or lower by having the hole trapping dopant and electron trapping dopant present. By making the light-emitting layer 4 hole mobility or electron mobility $10^{-5}$ cm$^2$/Vs or lower, the charge recombination region is wider, which enables the drive durability of the organic electroluminescent device to be increased.

Further, it is desirable for the bipolar host, light-emitting dopant and carrier trapping dopant contained in the light-emitting layer 4 to have a small interaction with each other. This is because if these substances have a large interaction, for example if they form a charge transfer complex, blue light emission may not be obtained due to the changes in the properties of the light-emitting layer 4 as a result of the formation of the charge transfer complex.

Next, the principles behind the organic electroluminescent device according to the present invention being able to efficiently emit blue light and having excellent continuous durability will be described in more detail.

Generally, organic electroluminescent devices are configured such that holes and electrons which have been respectively injected from an anode and a cathode, pass through respectively a hole transport layer and an electron transport layer and then recombine inside a light-emitting layer, whereby light is emitted. For this light emitting process to be carried out efficiently and continuously, consideration needs to be given to three points: (1) the charge transport process; (2) the recombination process; and (3) the recombination region. These three points will now each be described in more detail.

(1) Charge Transport Process

Transportation of the holes is carried out by hopping conduction of the cation molecules. On the other hand, transportation of the electrons is carried out by hopping conduction of the anion molecules.

Here, the energy level of the cation molecules (holes) can be determined by measuring the ionization potential. The measurement value of this ionization potential can be approximated to the highest occupied molecular orbital (HOMO). On the other hand, if the HOMO and the optical band gap are known, the energy level of the anion molecules (electrons) can be calculated as the sum thereof. This energy level can be approximated to the lowest unoccupied molecular orbital (LUMO). The HOMO and LUMO represented here are the negative values taking the vacuum levels as standard.

Moreover, if the light-emitting layer is formed by a host (bipolar host) and a dopant, charge mobility can be controlled according to the combination of the host and the dopant. The principles behind this control of the charge mobility will be described below with reference to the drawings.

Figure 2A:
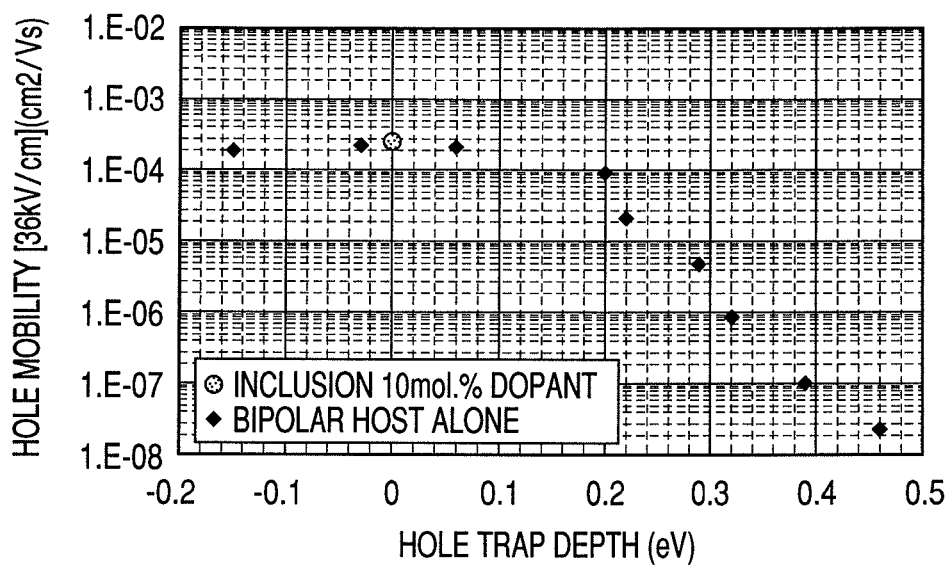
FIG. 2A is a graph illustrating the relationship between trap depth and hole mobility when 10 mol. % of various dopants is added to the bipolar host.
Figure 2B:
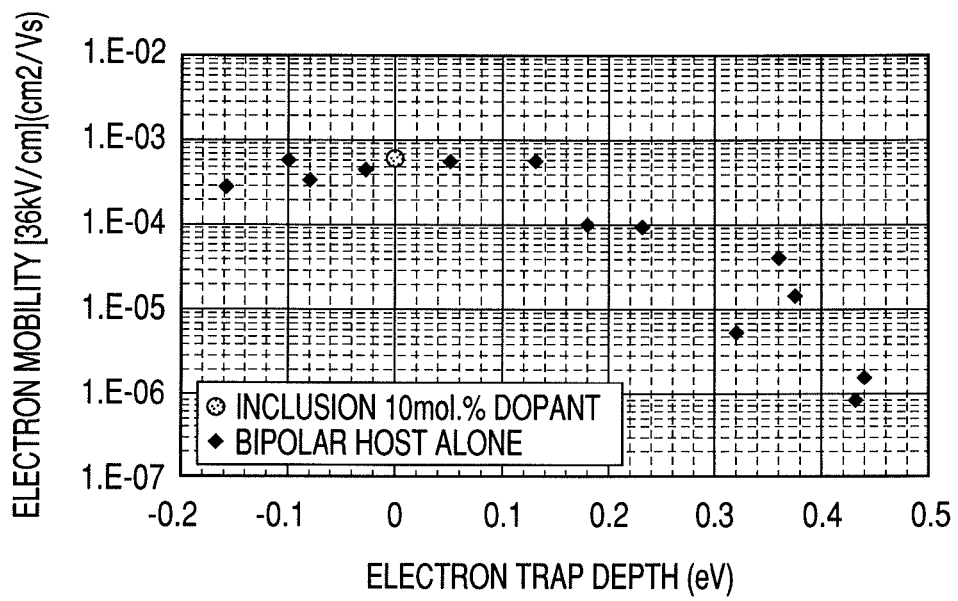
FIG. 2B is a graph illustrating the relationship between trap depth and electron mobility when 10 mol. % of various dopants is added to the bipolar host.

FIG. 2A is a graph illustrating hole mobility when 10 mol. % of various dopants is added to the bipolar host. FIG. 2B is a graph illustrating electron mobility when 10 mol. % of various dopants is added to the bipolar host.

In FIG. 2A, the horizontal axis represents the difference in HOMO between the bipolar host and the dopant (hereinafter, referred to as "hole trap depth"), and the vertical axis represents hole mobility under conditions of room temperature (25° C.) and a field intensity of 36 kV/cm. As a comparison, the hole mobility of the bipolar host by itself is also shown (the round dot where hole trap depth is 0 eV).

Further, in FIG. 2B, the horizontal axis represents the difference in LUMO between the bipolar host and the dopant (hereinafter, referred to as "electron trap depth"), and the vertical axis represents electron mobility under conditions of room temperature (25° C.) and a field intensity of 36 kV/cm. As a comparison, the electron mobility of the bipolar host alone is also shown (the round dot where electron trap depth is 0 eV).

In FIG. 2A, when the hole trap depth is in the vicinity of 0 eV, hole mobility hardly changes. However, as the hole trap depth increases, hole mobility decreases. Specifically, when the trap depth is 0.15 eV or greater, a decrease in hole mobility can be seen.

Similarly, in FIG. 2B, when the electron trap depth is in the vicinity of 0 eV, electron mobility hardly changes. However, as the electron trap depth increases, electron mobility decreases. Specifically, when the trap depth is 0.15 eV or greater, a decrease in electron mobility can be seen.

Therefore, by controlling the trap depth, it can be said that the charge mobility of the light-emitting layer can be controlled.

Figure 3:
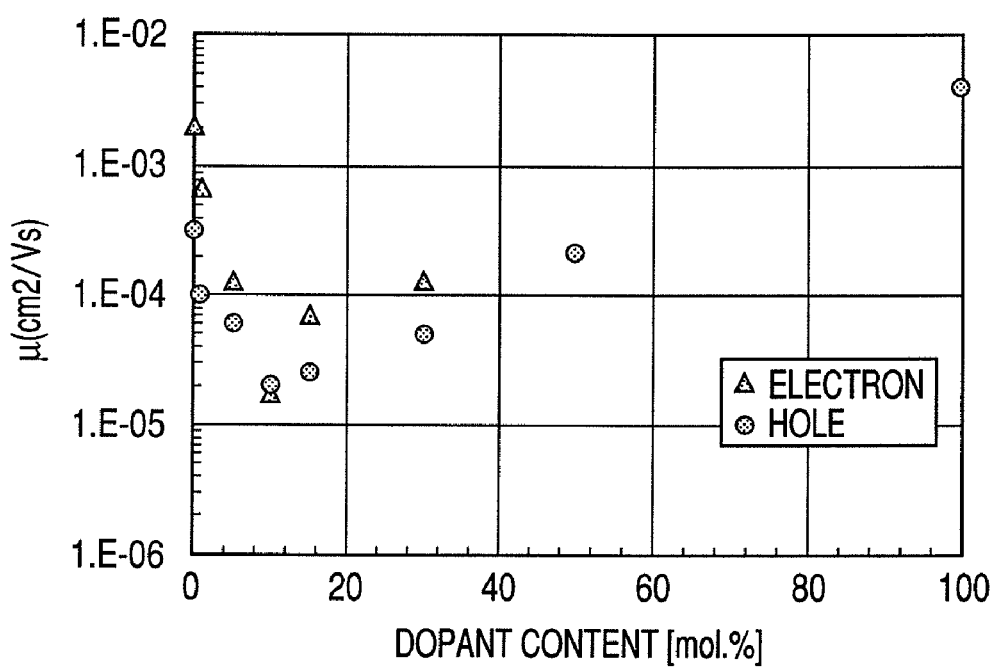
FIG. 3 is a graph illustrating the relationship between dopant concentration and charge mobility.

Further, the charge mobility of the light-emitting layer also changes according to the concentration of the dopant trapping the charges. FIG. 3 is a graph illustrating the relationship between dopant concentration in the light-emitting layer and the charge mobility of the light-emitting layer. From FIG. 3, it can be seen that if the dopant concentration is in the range of 0.1 mol. % to 30 mol. %, the charge mobility can be controlled to about 1/10 that when the charge mobility of the light-emitting layer is controlled only by the host.

(2) Recombination Process

To improve the light-emitting efficiency of an organic electroluminescent device, the holes and the electrons need to be efficiently recombined in the light-emitting layer for conversion into light-emitting excitons. Here, if the light-emitting layer is formed from one kind of molecule (in the present invention, if formed only from a bipolar host), the probability R of holes and electrons recombining may be represented by a Langevin relational equation represented by the following equation [1].

$$R = \frac{\mu_h + \mu_e}{\varepsilon \varepsilon_0} \quad [1]$$

In the above equation, "$\mu_h$" represents hole mobility, "$\mu_e$" represents electron mobility, "$\in$" represents the relative dielectric constant and "$\in_0$" represents the dielectric constant in vacuum. According to equation [1], it can be seen that the greater the charge mobility of the molecules (bipolar host)

forming the light-emitting layer, the higher the probability of the holes and the electrons recombining becomes.

Next, the case where the light-emitting layer is formed from a host (bipolar host) and a guest (light-emitting dopant) will be considered.

Figure 4A:
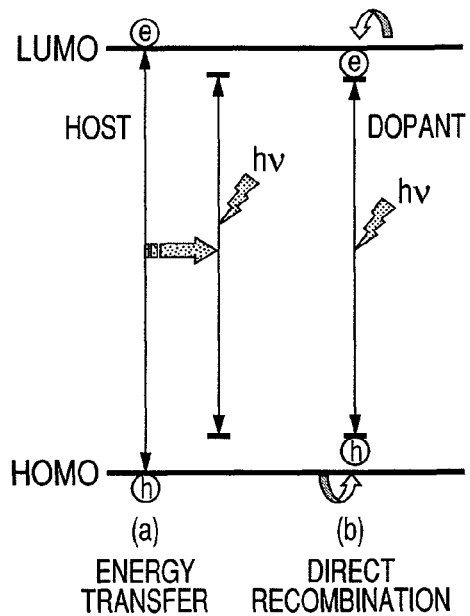
FIGS. 4A, 4B and 4C are series of schematic diagrams illustrating the process in which light-emitting excitons (dopant excitons) are produced when the light-emitting layer is formed from a host and a guest (light-emitting dopant).
Figure 4B:
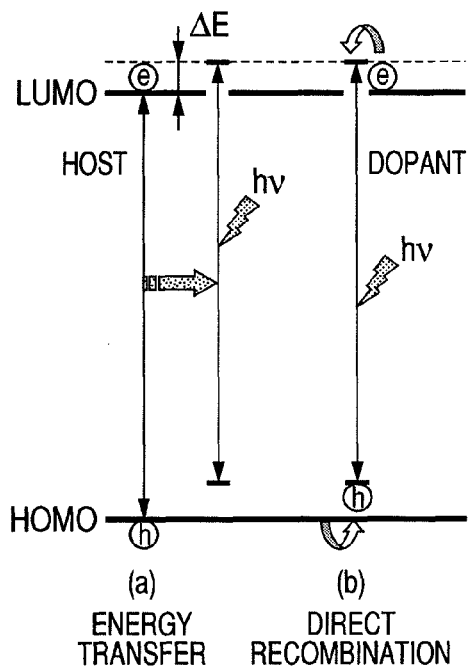
Figure 4C:
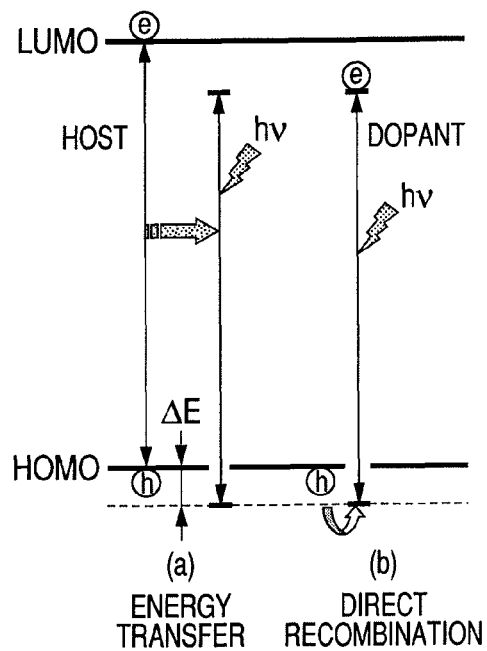

FIGS. 4A, 4B and 4C are a series of schematic diagrams illustrating the process in which light-emitting excitons (dopant excitons) are produced when the light-emitting layer is formed from a bipolar host and a light-emitting dopant. Here, FIG. 4A shows the case where the HOMO of the light-emitting dopant is higher than the HOMO of the bipolar host, and the LUMO of the light-emitting dopant is lower than the LUMO of the bipolar host. FIG. 4B shows the case where the HOMO and the LUMO of the light-emitting dopant are both higher than the HOMO and the LUMO of the bipolar host. FIG. 4C shows the case where the HOMO and the LUMO of the light-emitting dopant are both lower than the HOMO and the LUMO of the bipolar host.

From FIGS. 4A, 4B and 4C, the following two kinds of process can be thought of regarding how the dopant excitons are formed.

(a) An energy transfer process from host excitons produced by the recombination of the charges in the bipolar host molecules (Foerster mechanism).

(b) A direct charge recombination process in the light-emitting dopant molecules.

Here, a case like that in FIG. 4A, where the energy levels (HOMO and LUMO) of the light-emitting dopant molecule are inside those of the bipolar host molecule, will now be considered. At this stage, the direct charge recombination process (b) is predominant.

However, most blue-light-emitting dopants have a wide energy gap. Thus, it is very difficult to attain the energy level relationship like that shown in FIG. 4A, and the energy level relationship tends to become like that shown in FIG. 4B, for example. In such a case, to make the direct charge recombination process (b) predominant, the electrons in the LUMO of the bipolar host must overcome the energy barrier $\Delta E$ and transfer to the LUMO of the light-emitting dopant. Similarly, like the case of FIG. 4C, the holes in the HOMO of the bipolar host must overcome the energy barrier $\Delta E$ and transfer to the HOMO of the light-emitting dopant.

At this stage, the probability r of the charges transferring from the bipolar host to the light-emitting dopant may be represented by the following relational equation [2].

$$r = \mu_e F \exp\left(-\frac{\Delta E}{k_b T}\right) \quad [2]$$

In the above equation, "F" represents the field intensity, "$\Delta E$" represents the magnitude of the energy barrier, "$k_b$" represents the Boltzmann factor and "T" represents the temperature.

From equation [2], for identical field intensities, a higher charge mobility of the bipolar host increases the recombination probability, thereby allowing light emitting efficiency to be increased. In the present invention, the hole mobility and the electron mobility of the bipolar host may both be $10^{-4}$ cm$^2$/Vs or greater.

(3) Recombination Region

On the other hand, to improve the drive durability of an organic electroluminescent device, it is effective to widen the emission region. This is because if the emission region is wider, the stress which can be produced during the repeated excitation/light emission process of the light-emitting dopant can be alleviated without having the stress concentrated in one place.

Here, to widen the emission region, it is effective to slow both the hole mobility and the electron mobility. By decreasing hole mobility and electron mobility, the charge density required in order to make the same current flow can be increased, whereby the recombination of the holes and the electrons is more likely to occur across the whole light-emitting layer region. Further, to widen the emission region, the transport properties of the holes or the electrons may be set in a region which is subject to the limits of space charge. By doing this, the recombination region can be further widened, which enables the emission region to be widened even further.

The current density conditions which can widen the emission region may be determined using the simple space charge limit equation represented by the following equation [3].

$$J = \frac{9\varepsilon\varepsilon_0 \mu V^2}{8d^3} \quad [3]$$

In the above equation, "J" represents the maximum current density flowing through the light-emitting layer, "$\varepsilon$" represents the relative dielectric constant, "$\varepsilon_0$" represents the dielectric constant in vacuum, "$\mu$" represents charge mobility, "V" represents potential difference and "d" represents film thickness.

Here, the value of the maximum current density producing the effect of space charge will be estimated for when film thickness d=1,000 nm, potential difference=1 V, relative dielectric constant $\varepsilon$=3.0 and charge mobility is $10^{-4}$ cm$^2$/Vs. The estimated result is that the maximum current density of the current flowing through the light-emitting layer is about 30 mA/cm$^2$. Considering that the effect of space charge only actually begins to be felt from about 1/10 of the maximum current density, if the charge mobility is $10^{-5}$ cm$^2$/Vs, the charge mobility at which the effects of space charge are felt is 0.3 mA/cm$^2$. This value corresponds to the current region where an organic electroluminescent device starts to light up. Therefore, when the charge mobility is $10^{-5}$ cm$^2$/Vs or lower, if the organic electroluminescent device has started to light up, the advantages from the effect of space charge can be expected.

From the perspective of the above-described three points (1) the charge transport process, (2) the recombination process, and (3) the recombination region, to obtain an organic electroluminescent device which efficiently emits blue light and has good drive durability, it is necessary to satisfy the following conditions.

Seen from the perspective of (1) the charge transport process, in the energy level relationship between the bipolar host and the dopant, the dopant is selected so that the trap depth $\Delta E_{trap}$ is desirably 0.15 eV or greater, and more desirably 0.2 eV or greater. Here, the "trap depth $\Delta E_{trap}$" is, for holes:

$\Delta E_{trap} = \Delta E_H =$ [HOMO of dopant]−[HOMO of host]

and for electrons:

$\Delta E_{trap} = \Delta E_L =$ [LUMO of dopant]−[LUMO of host]

Further, to effectively control the charge mobility of the light-emitting layer, the dopant concentration (dopant content) is desirably 0.1 mol. % to 30 mol. %, and more desirably 0.5 mol. % to 20 mol. %. This is because too low or too high a dopant concentration is unsuitable for controlling the charge mobility of the light-emitting layer, and further, because a high dopant concentration becomes a factor in decreasing the efficiency of concentration quenching and a factor in device deterioration.

Seen from the perspective of (2) the recombination process, the hole mobility and the electron mobility of the bipolar host both need to be $10^{-4}$ cm$^2$/Vs or greater.

Seen from the perspective of (3) the recombination region, the hole mobility and the electron mobility of the light-emitting layer both need to be 1/10 or lower the hole mobility and the electron mobility of the bipolar host by itself.

Further, the hole mobility or electron mobility of the light-emitting layer is desirably $10^{-5}$ cm$^2$/Vs or lower.

Further, the carrier trapping dopant is desirably an electron trapping dopant and the light-emitting dopant is desirably a hole trapping dopant. This is especially effective in improving drive life. In such a case, some of the holes injected into the light-emitting layer are trapped by the light-emitting dopant, and some of the electrons are trapped by the carrier trapping dopant. Subsequently, the light-emitting dopant undergoes the direct recombination process b) of FIG. 4(B), and quickly emits light. However, the recombination rate for the carrier trapping dopant is thought to be slower than that for the light-emitting dopant. This is because the energy gap $E_{gd}$ of the carrier trapping dopant is wide, so that the ΔE of equation [2] increases. As a result, an electron-dense state can be maintained in the light-emitting layer, whereby the oxidation degradation of the light-emitting layer material can be suppressed.

In the organic electroluminescent device according to the present invention, compounds used as the electron trapping dopant can contain a fluoranthene skeleton. The fluoranthene skeleton can attain a compound having a large electron affinity (specifically, a compound having a large LUMO absolute value) by having a five-member ring structure. Further, the energy gap of the fluoranthene skeleton is sufficiently wide, and even if a substituent is introduced, it is relatively easy to obtain a compound having the wide energy gap which is required in the present invention. Examples of compounds having a fluoranthene skeleton include, but are not limited to, the following.

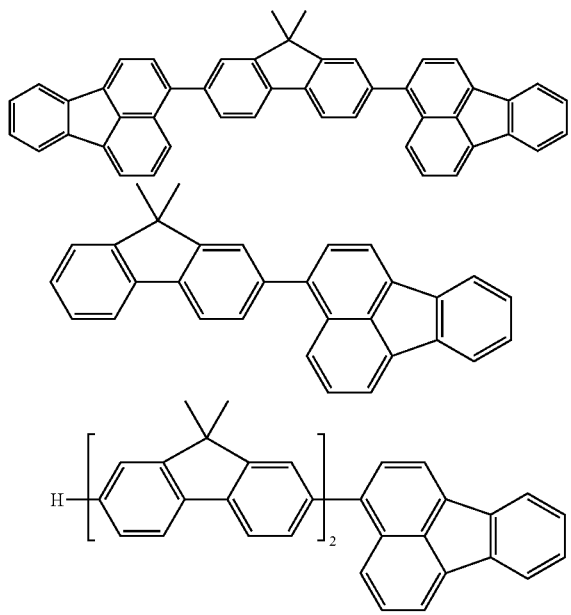

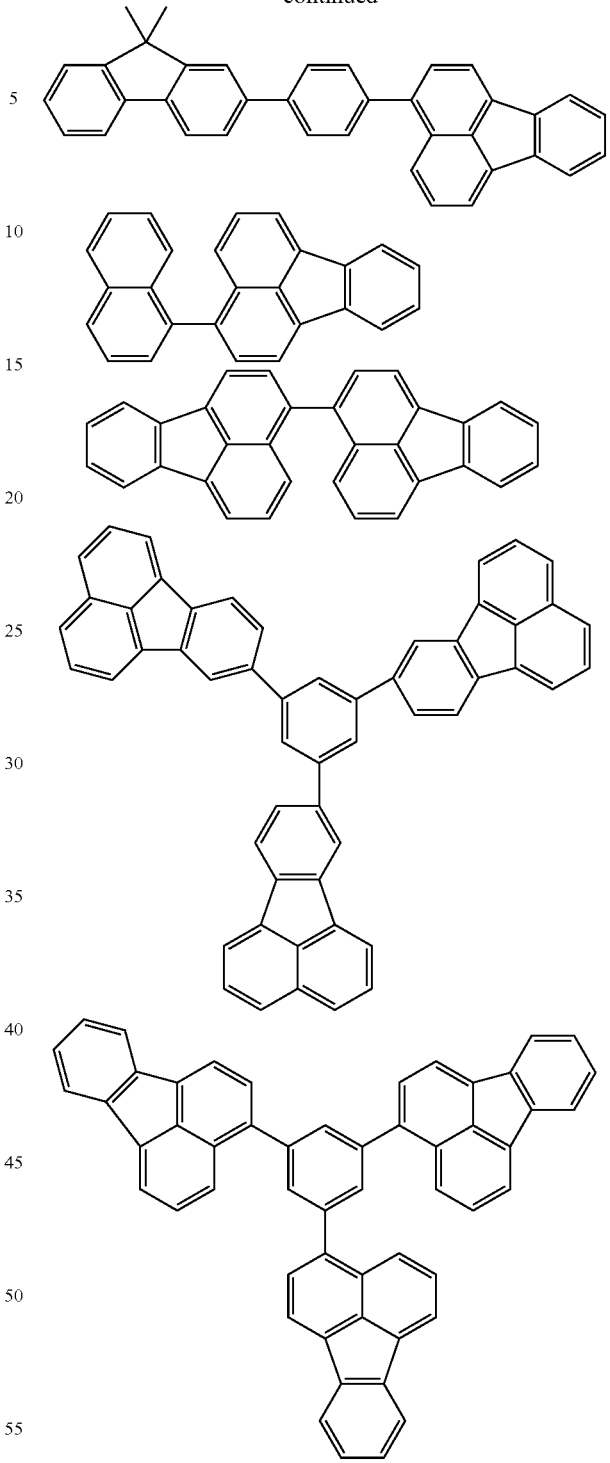

Next, the materials constituting the layers other than the light-emitting layer in the organic electroluminescent device according to the present invention will be described.

The hole transporting material constituting the hole transport layer desirably has excellent hole mobility for facilitating the injection of holes from the anode and transporting the injected holes to the light-emitting layer. Examples of low-molecular-weight materials and high-molecular-weight materials having such hole injection/transport performance include, but are of course not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, poly(vinylcarbazole), poly(silylene), poly(thiophene) and other conductive polymers.

The electron injecting/transporting material constituting the electron transport layer can be arbitrarily selected from materials having a function for facilitating the injection of electrons from the cathode and transporting the injected electrons to the light-emitting layer. This material is selected in consideration of, for example, the balance with the hole mobility of the hole transport material. Examples of materials having an electron injection/transport performance include, but are of course not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives and organometallic complexes. In addition, among these, a material having a large ionization potential can be used also as a hole blocking material.

The substrate used for the organic electroluminescent device according to the present invention is not especially limited, but an opaque substrate such as a metal substrate or a ceramic substrate, or a transparent substrate such as glass, quartz, or a plastic sheet may be used. In addition, a color filter film, a fluorescent color conversion filter film, a dielectric reflective film and the like can be used in the substrate to control colored light emission. In addition, the organic electroluminescent device can be fabricated by fabricating a thin film transistor (TFT) on the substrate and connecting the TFT to the substrate.

Further, a two-dimensional array of TFTs serving as pixels can be used as a display. For example, an array of light-emitting pixels of the three colors of red, green and blue can be used as a full-color display.

In addition, with regard to the direction of extracting light from the device, either a bottom emission structure (structure in which light is extracted from the substrate side) or a top emission structure (structure in which light is extracted from the side opposite to the substrate) may be used.

The material for the anode desirably has as large a work function as possible. Examples of a material that can be used include single metals such as, gold, platinum, silver, copper, nickel, palladium, cobalt, selenium, vanadium and tungsten, as well as alloys combining these single metals, and metal oxides such as tin oxide, zinc oxide, indium oxide, indium tin oxide (ITO) and indium zinc oxide. Conductive polymers such as polyaniline, polypyrrole, polythiophen and polyphenylene sulfide can also be used. These electrode substances can be used alone, or in combination of two or more thereof. In addition, the anode may be constituted of a single layer or of a plurality of layers.

On the other hand, the cathode material desirably has as small a work function as possible. Examples thereof include single metals such as lithium, sodium, potassium, calcium, magnesium, aluminum, indium, ruthenium, titanium, manganese, yttrium, silver, lead, tin and chromium. Further, alloys combining these single metals may also be used. Examples thereof include lithium-indium, sodium-potassium, magnesium-silver, aluminum-lithium, aluminum-magnesium, magnesium-indium and the like. Metal oxides such as indium tin oxide (ITO) can also be used. These electrode substances can be used alone, or in combination of two or more thereof. The cathode may be constituted of a single layer or of a plurality of layers. Further, an electron injection layer formed by co-deposition of an organic electron transport material and an alkali metal may be provided between the cathode and the organic electron transport layer. This electron injection layer is effective in lowering the voltage of the drive voltage.

In addition, it is desirable for at least one of the anode and the cathode to be transparent or semi-transparent in order to extract light.

The fabricated device may be provided with a protective layer or a sealing layer to prevent the device from coming into contact with oxygen, moisture and the like. Examples of the protective layer include a diamond thin film; inorganic material films of, for example, a metal oxide or a metal nitride; polymer films such as fluorine resin, polyparaxylene, polyethylene, silicone resin and polystyrene resin; photocurable resins, and the like. In addition, the device itself can be covered with glass, a gas impermeable film, metal and the like, and packaged with an appropriate sealing resin.

In the organic electroluminescent device according to the present invention, the layer formed of an organic compound may be obtained by various methods. In general, thin films are formed by vacuum deposition, ionized deposition, sputtering or plasma CVD. Alternatively, thin films are formed by dissolving the material for the film in an appropriate solvent, and subjecting the solution to a known coating method (such as spin coating, dipping, casting, an LB method, an ink-jet method etc.). In particular, when the film is formed by a coating method, the film can be formed in combination with an appropriate binder resin.

The above-mentioned binder resin can be selected from a wide range of binding resins. Examples thereof include, but are not limited to, a polyvinyl carbazole resin, a polycarbonate resin, a polyester resin, a polyallylate resin, a polystyrene resin, an ABS resin, a polybutadiene resin, a polyurethane resin, an acrylic resin, a methacrylic resin, a butyral resin, a polyvinyl acetal resin, a polyamide resin, a polyimide resin, a polyethylene resin, a polyether sulfone resin, a diallyl phthalate resin, a phenol resin, an epoxy resin, a silicone resin, a polysulfone resin, and a urea resin. In addition, these may be used alone or two or more kinds may be mixed as a copolymer. Further, known additives, such as a plasticizer, an antioxidant and a UV absorber, may optionally be used in combination therewith.

EXAMPLES

The present invention will now be described in more detail with the following examples. However, the present invention is not limited to these examples.

(1) Materials Constituting the Light-Emitting Layer

In the respective examples and comparative examples, the organic electroluminescent device illustrated in FIG. 1 was fabricated. As the materials constituting the light-emitting layer, the compounds represented below were used.

Compound A1
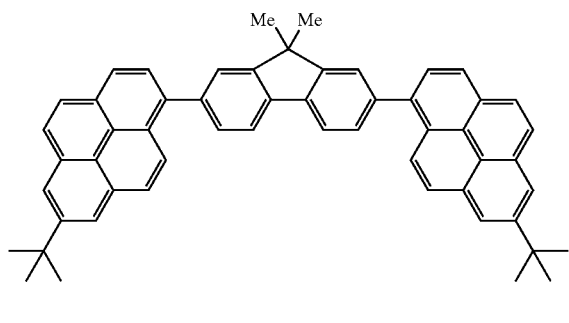
Compound A2
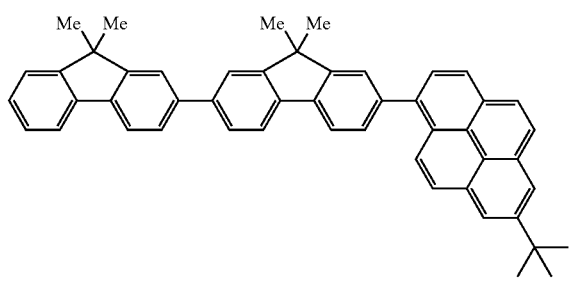
Compound A3
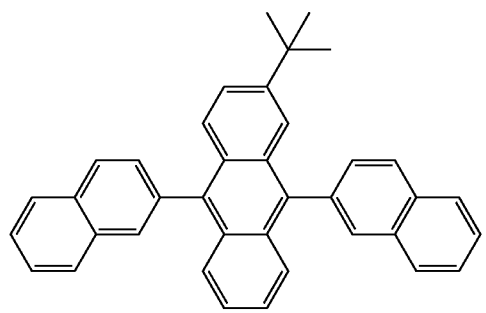
Compound B1
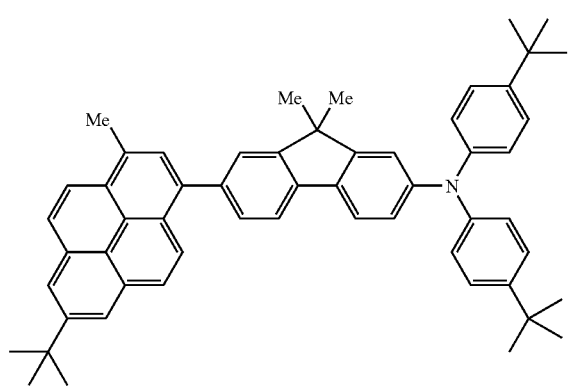
Compound B2
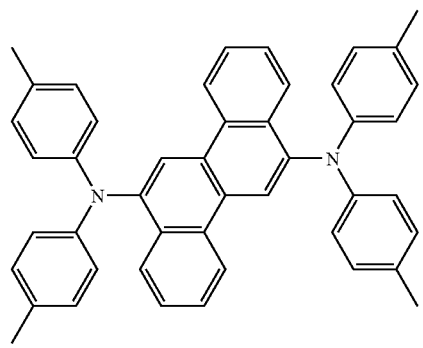
Compound C1
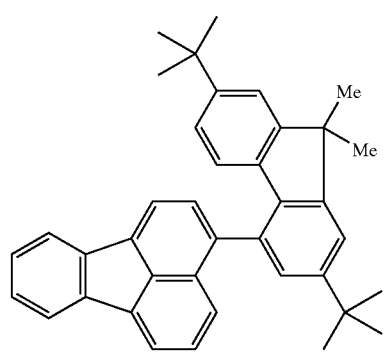
Compound C2
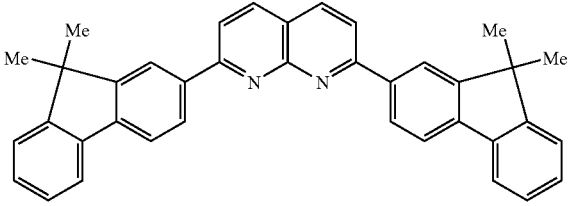
Compound C3
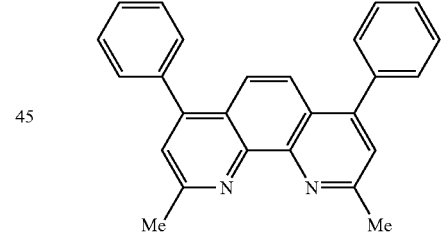
Compound C4
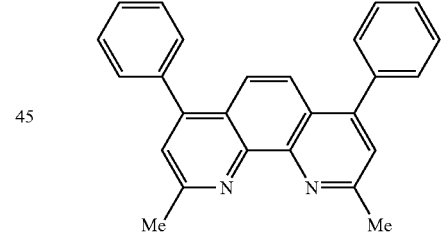
(2) Evaluation of the Physical Properties of the Materials Constituting the Light-Emitting Layer
The physical properties of the materials shown above constituting the light-emitting layer were evaluated.

(a) Highest Occupied Molecular Orbital (HOMO) Energy

Measured using photoelectron spectroscopy in air (Measurement device: AC-1, manufactured by Rikenkiki Co., Ltd.)

(b) Energy Gap

Determined from the visible light-ultraviolet absorption spectrum. Specifically, the materials constituting the light-emitting layer were deposited on a glass substrate, the visible light-ultraviolet absorption spectrum of that thin film was measured, and the energy gap was determined from the absorption edge of the absorption spectrum. The spectrophotometer U-3010 manufactured by Hitachi, Ltd., was used as the apparatus.

(c) Lowest Unoccupied Molecular Orbital (LUMO) Energy

Calculated from the respective measurement values of the above-described energy gap and HOMO energy. Specifically, the LUMO energy was calculated from the following equation.

[LUMO energy]=[HOMO energy]+[Energy gap]

(d) Hole Mobility, Electron Mobility

A device for charge mobility measurement was fabricated, and the hole mobility and electron mobility were measured by transient current measurement using a TOF (Time of Flight) method. Here, the "device for charge mobility measurement" refers to a device fabricated by forming a thin film composed of a bipolar host to a thickness of 2 to 4 μm by vacuum deposition on a glass substrate having ITO, and then depositing aluminum as a counter electrode on this thin film by vapor deposition. The hole mobility and the electron mobility of this device for charge mobility measurement were measured at a field intensity of 20 to 100 kV/cm using a TOF measurement apparatus (TOF-301, manufactured by Optel Co., Ltd.)

(3) Concerning the Results of the Evaluation of the Physical Properties of the Materials Constituting the Light-Emitting Layer The above-described compounds A1 to A3, B1 and B2, and C1 to C4 were evaluated for HOMO, LUMO and energy gap. The results are shown in Table 1.

TABLE 1

|  | HOMO (eV) | LUMO (eV) | Energy gap (eV) |
| --- | --- | --- | --- |
| Compound A1 | −5.67 | −2.72 | 2.95 |
| Compound A2 | −5.61 | −2.64 | 2.97 |
| Compound A3 | −5.74 | −2.80 | 2.94 |

TABLE 1-continued

|  | HOMO (eV) | LUMO (eV) | Energy gap (eV) |
| --- | --- | --- | --- |
| Compound B1 | −5.29 | −2.42 | 2.87 |
| Compound B2 | −5.35 | −2.60 | 2.75 |
| Compound C1 | −6.03 | −2.97 | 3.06 |
| Compound C2 | −5.95 | −3.05 | 2.90 |
| Compound C3 | −6.30 | −2.74 | 3.56 |
| Compound C4 | −5.98 | −2.98 | 3.00 |

Example 1

A film of indium tin oxide (ITO) was sputtered as an anode 2 on a glass substrate (substrate 1) to a thickness of 130 nm. The substrate was subjected to ultrasonic cleaning with acetone and isopropyl alcohol (IPA) in that order, washed and boiled with IPA and then dried. Next, the substrate was subjected to UV/ozone cleaning. The thus-treated substrate was used as a transparent conductive support substrate.

Next, as a hole transport layer 3, a chloroform solution of compound 1 having the following formula was prepared to a concentration of 0.1 wt. %.

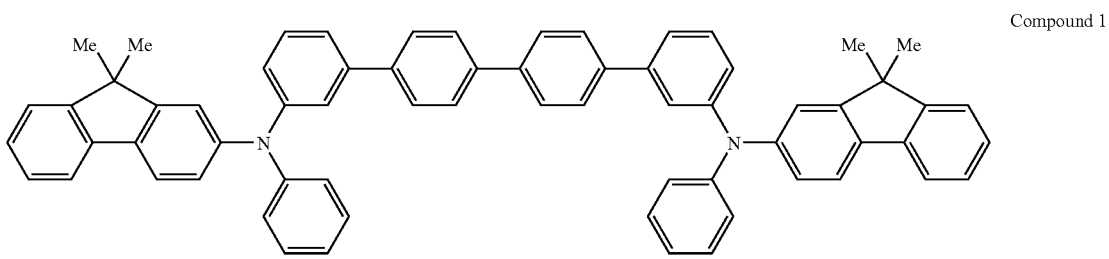

Compound 1

This solution was dropped onto the above-described ITO electrode. The ITO electrode was then subjected to spin coating at a revolving speed of 500 rpm for 10 seconds at first and then 1,000 rpm for 1 minute to form a thin film thereon. Next, the electrode was dried in a vacuum oven at 80° C. for 10 minutes to completely remove the solvent in the thin film. The thickness of the formed hole transport layer 3 was 15 nm.

Next, a light-emitting layer 4 was formed. The light-emitting layer 4 was formed by simultaneously vapor depositing, from respectively separate boats, compound A1 as the bipolar host material, compound B1 as the light-emitting dopant, and compound C1 as the electron trapping dopant. At this stage, the concentrations of compound A1, compound B1 and compound C1 were respectively 80 mol. %, 10 mol. % and 10 mol. %. Further, the thickness of the light-emitting layer 4 was 25 nm.

Next, BPhen having the following formula was deposited as an electron transport layer 5 by vacuum deposition. At this stage, the degree of vacuum during vacuum deposition was $1.0 \times 10^{-4}$ Pa and the deposition rate was about 0.1 nm/sec or more to 0.3 nm/sec or less. Further, the thickness of the electron transport layer 5 was 25 nm.

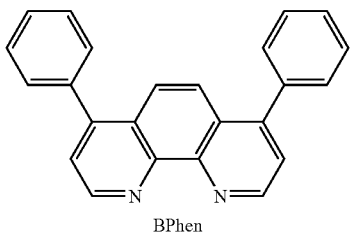
BPhen

Next, lithium fluoride (LiF) was deposited on the electron transport layer 5 to a thickness of 0.5 nm by vacuum deposition. At this stage, the degree of vacuum during vacuum deposition was $1.0\times10^{-4}$ Pa and the deposition rate was 0.05 nm/sec. Then, an aluminum film was formed to a thickness of 150 nm by vacuum deposition. At this stage, the degree of vacuum during vacuum deposition was $1.0\times10^{-4}$ Pa and the deposition rate was about 1.0 nm/sec or more to 1.2 nm/sec or less. Here, the lithium fluoride film and the aluminum film both function as an electron injection electrode (cathode 6).

Next, in a dry air atmosphere, the substrate was covered with a protective glass plate and sealed with an acrylic resin binder to prevent deterioration of the device from moisture adsorption, whereby an organic electroluminescent device was fabricated.

A voltage of 4.5 V was applied to the obtained organic electroluminescent device with the ITO electrode (anode 2) as the positive electrode and the aluminum electrode (cathode 6) as the negative electrode. As a result, blue light emission was observed originating from compound B1 having a luminescence of 4,200 cd/m², a luminous efficiency of 4.0 lm/W, and a maximum emission wavelength of 460 nm. Further, when a voltage was applied to the device under a nitrogen atmosphere while keeping the current density at 30 mA/cm², the luminance half-life was about 1,000 hours, which was long.

Next, the following tests were carried out to evaluate the charge mobility of the light-emitting layer 4 itself.

First, a device for charge mobility measurement was fabricated. Specifically, a thin film was formed by co-depositing compound A1, compound B1, and compound C1 onto an ITO glass substrate so that the concentrations of compound A1, compound B1 and compound C1 were respectively 80 mol. %, 10 mol. % and 10 mol. %. The film thickness at this stage was 3.2 μm. Then, an aluminum film was formed to a thickness of 150 nm by vacuum deposition on the thin film. Next, in a dry air atmosphere, the substrate was covered with a protective glass plate and filled with a UV type binder which was then cured to prevent deterioration of the device from moisture being adsorbed on the surface of the deposited film of the device, whereby a device for charge mobility measurement was obtained.

In addition, a comparison sample was prepared by fabricating a device in the same manner as the above-described device for charge mobility measurement, except that a thin film consisting only of compound A1 was formed on the ITO glass substrate to a thickness of 2.5 μm by vacuum deposition.

The charge mobility of the devices for charge mobility measurement was measured using a time-of-flight measurement apparatus (TOF-301, manufactured by Optel Co., Ltd.).

From the comparison sample measurement, the bipolar host material A1 had a hole mobility of $1.7\times10^{-4}$ cm²/Vs and an electron mobility of $1.3\times10^{-3}$ cm²/Vs (applied field of 36 kV/cm). The fabricated device for charge mobility measurement was found to have a hole mobility and an electron mobility that were both ⅒ or lower that of the comparison sample. Further, hole mobility was $1.2\times10^{-7}$ cm²/Vs, which was sufficiently lower than $10^{-5}$ cm²/Vs.

Comparative Example 1

An electroluminescent device was fabricated in the same manner as in Example 1, except that the light-emitting layer 4 was formed by carrying out the co-deposition so that the concentrations of compound A1 and compound B1 were respectively 90 mol. % and 10 mol. %.

When a voltage of 4.5 V was applied to the obtained device, blue light emission was observed originating from compound B1 having a luminescence of 4,300 cd/m², a luminous efficiency of 4.2 lm/W, and a maximum emission wavelength of 460 nm. Further, when a voltage was applied to the device under a nitrogen atmosphere while keeping the current density at 30 mA/cm², the luminance half-life was about 200 hours, which was shorter than in Example 1.

Next, to evaluate the charge mobility of the light-emitting layer 4 itself, a device for charge mobility measurement was fabricated with a 2.1-μm-thick thin film having the same mixing ratio as this light-emitting layer, and the charge mobility of the device was measured. The fabricated device for charge mobility measurement had an electron mobility of $6.5\times10^{-4}$ cm²/Vs, which was about ½ that of the bipolar host (compound A1).

Comparative Example 2

A device was fabricated in the same manner as in Example 1, except that the light-emitting layer 4 was formed by carrying out the co-deposition so that the concentrations of compound A1, compound B1 and compound C2 were respectively 85 mol. % and 10 mol. %, and 5 mol. %.

When a voltage of 4.5 V was applied to the obtained device, blue light emission was observed originating from compound B1 having a luminescence of 3,800 cd/m², a luminous efficiency of 3.6 lm/W, and a maximum emission wavelength of 460 nm. Further, when a voltage was applied to the device under a nitrogen atmosphere while keeping the current density at 30 mA/cm² the luminance half-life was about 820 hours. The reason why luminous efficiency was lower and drive life was shorter than in Example 1 can be considered as being because the energy gap of the electron trapping dopant C2 was smaller than that of the bipolar host A1.

Next, to evaluate the charge mobility of the light-emitting layer 4 itself, a device for charge mobility measurement was fabricated with a 2.6-μm-thick thin film having the same mixing ratio as this light-emitting layer, and the charge mobility of the device was measured. The fabricated device for charge mobility measurement had a hole mobility of $1.4\times10^{-7}$ cm²/Vs and an electron mobility of $9.0\times10^{-6}$ cm²/Vs. From these results, the charge mobility could be decreased to 1/10 or lower that of the host compound. Further, hole mobility was $1.4\times10^{-7}$ cm²/Vs, which was sufficiently lower than $10^{-5}$ cm²/Vs.

Comparative Example 3

A device was fabricated in the same manner as in Example 1, except that the light-emitting layer 4 was formed by carrying out the co-deposition so that the concentrations of compound A1, compound B1 and compound C3 were respectively 80 mol. %, 10 mol. %, and 10 mol. %.

When a voltage of 4.5 V was applied to the obtained device, blue light emission was observed originating from compound B1 having a luminescence of 3,800 cd/m², a luminous efficiency of 3.9 lm/W, and a maximum emission wavelength of 460 nm. Further, when a voltage was applied to the device under a nitrogen atmosphere while keeping the current density at 30 mA/cm², the luminance half-life was about 60 hours, which was short.

Next, to evaluate the charge mobility of the light-emitting layer 4 itself, a device for charge mobility measurement was fabricated with a 2.3-µm-thick thin film having the same mixing ratio as this light-emitting layer, and the charge mobility of the device was measured. The fabricated device for charge mobility measurement had an electron mobility of $1.1\times10^{-3}$ cm²/Vs, which was about the same as the bipolar host (compound A1). The reason for this can be considered as being because the difference between the LUMO energy of the bipolar host A1 and the LUMO energy of compound C3 was 0.02 eV, meaning that the electron trapping performance was insufficient.

Comparative Example 4

A device was fabricated in the same manner as in Example 1, except that the light-emitting layer 4 was formed by carrying out the co-deposition so that the concentrations of compound A3, compound B1 and compound C1 were respectively 85 mol. %, 10 mol. %, and 5 mol. %.

When a voltage of 4.5 V was applied to the obtained device, blue light emission was observed originating from compound B1 having a luminescence of 1,200 cd/m², a luminous efficiency of 2.3 lm/W, and a maximum emission wavelength of 460 nm. Further, when a voltage was applied to the device under a nitrogen atmosphere while keeping the current density at 30 mA/cm², the luminance half-life was about 30 hours, which was short.

The reason why luminous efficiency and drive life were shorter is believed as being because the hole mobility of compound A3 was $10^{-7}$ cm²/Vs, which is slow.

Example 2

The anode 2 was formed on the glass substrate (substrate 1) in the same manner as in Example 1. Next, using the compound 2 represented by the following formula, the hole transport layer 3 was formed in the same manner as in Example 1.

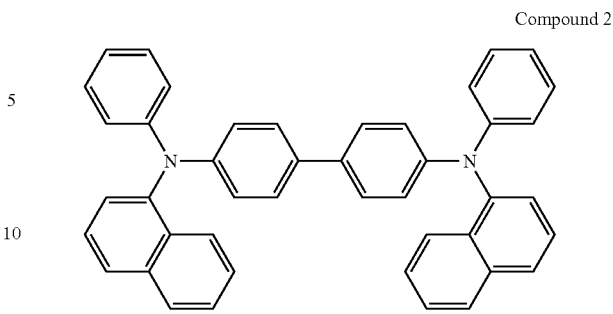

Compound 2

Next, the light-emitting layer 4 was formed by co-depositing so that the concentrations of compound A2, compound B2 and compound C4 were respectively 85 mol. %, 5 mol. %, and 10 mol. %. At this stage, the thickness of the light-emitting layer 4 was 25 nm.

Next, 2,9-bis[2-(9,9-dimethylfluorenyl)]phenanthroline was formed as the electron transport layer 5 in the same manner as in Example 1, and the electron injection electrode was formed in the same manner as in Example 1. Then, the substrate was sealed in the same manner as in Example 1 to obtain an organic electroluminescent device.

A voltage of 4.5 V was applied to the obtained organic electroluminescent device with the ITO electrode (anode) as the positive electrode and the aluminum electrode (cathode) as the negative electrode. As a result, blue light emission was observed originating from compound B2 having a luminescence of 1,500 cd/m², a luminous efficiency of 4.5 lm/W, and a maximum emission wavelength of 465 nm. Further, when a voltage was applied to the device under a nitrogen atmosphere while keeping the current density at 30 mA/cm², the luminance half-life was about 400 hours, which was long.

Next, when the charge mobility of compound A2 was measured, hole mobility was $1.2\times10^{-4}$ cm²/Vs and electron mobility was $7.0\times10^{-4}$ cm²/Vs applied field of 36 kV/cm).

The hole mobility and electron mobility of the light-emitting layer 4 were 1/10 or lower that of the bipolar host (compound A2).

Comparative Example 5

A device was fabricated in the same manner as in Example 2, except that the light-emitting layer 4 was formed by carrying out the co-deposition so that the concentrations of compound A2 and compound B2 were respectively 95 mol. % and 5 mol. %.

When a voltage of 4.5 V was applied to the obtained device, blue light emission was observed originating from compound B2 having a luminescence of 1,600 cd/m², a luminous efficiency of 4.6 lm/W, and a maximum emission wavelength of 465 nm. Further, when a voltage was applied to the device under a nitrogen atmosphere while keeping the current density at 30 mA/cm², the luminance half-life was about 150 hours, which was shorter than in Example 2.

TABLE 2

|  | Host | Light-emitting dopant | Dopant | Applied voltage (V) | Luminescence (cd/m²) | Luminous efficiency (lm/W) | Luminance half-life (h) @ 30 mA/cm² |
|---|---|---|---|---|---|---|---|
| Example | A1 (bipolar host) | B1 (hole trapping dopant) | C1 (electron trapping dopant) | 4.5 | 4200 | 4.0 | 1000 |
| Comparative Example 1 | A1 (bipolar host) | B1 (hole trapping dopant) | None | 4.5 | 4300 | 4.2 | 200 |
| Comparative Example 2 | A1 (bipolar host) | B1 (hole trapping dopant) | C2 (electron trapping dopant) | 4.5 | 3800 | 3.6 | 820 |
| Comparative Example 3 | A1 (bipolar host) | B1 (hole trapping dopant) | C3 | 4.5 | 3800 | 3.9 | 60 |
| Comparative Example 4 | A3 | B1 (hole trapping dopant) | C1 (electron trapping dopant) | 4.5 | 1200 | 2.3 | 30 |
| Example 2 | A2 (bipolar host) | B2 (hole trapping dopant) | C4 (electron trapping dopant) | 4.5 | 1500 | 4.5 | 400 |
| Comparative Example 5 | A2 (bipolar host) | B2 (hole trapping dopant) | None | 4.5 | 1600 | 4.6 | 150 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-118405, filed Apr. 27, 2007 and 2008-065788, filed Mar. 14, 2008, which are hereby incorporated by reference herein in their entirety.

What is claimed is:

1. An organic electroluminescent device for emitting blue light comprising:
    an anode and a cathode, and
    a layer which comprises an organic compound interposed between the anode and the cathode, the layer which comprises the organic compound including at least a light-emitting layer,
    wherein the light-emitting layer comprises a bipolar host having a hole mobility and an electron mobility of $10^{-4}$ cm²/Vs or greater, a light-emitting dopant and a carrier trapping dopant;
    wherein the light-emitting dopant energy gap $E_{gB}$, the bipolar host energy gap $E_{gh}$, and the carrier trapping dopant energy gap $E_{gd}$ are such that $E_{gd} > E_{gh} > E_{gB}$; and
    wherein when the light-emitting dopant is a hole trapping dopant and the HOMO of the light-emitting dopant is shallower than the HOMO of the bipolar host, the carrier trapping dopant is an electron trapping dopant and the LUMO of the carrier trapping dopant is deeper than the LUMO of the bipolar host; and
    wherein when the light-emitting dopant is an electron trapping dopant and the LUMO of the light-emitting dopant is deeper than the LUMO of the bipolar host, the carrier trapping dopant is a hole trapping dopant and the HOMO of the carrier trapping dopant is shallower than the HOMO of the bipolar host.

2. The organic electroluminescent device according to claim 1, wherein the carrier trapping dopant is an electron trapping dopant, and the light-emitting dopant is a hole trapping dopant.

3. The organic electroluminescent device according to claim 1, wherein the light-emitting layer hole mobility or electron mobility is $10^{-5}$ cm²/Vs or lower.

4. The organic electroluminescent device according to claim 1, wherein an energy difference $\Delta E_H$ between the hole trapping dopant HOMO and the bipolar host HOMO is 0.15 eV or greater, and the hole trapping dopant has a content in the light-emitting layer of 0.1 mol. % to 30 mol. %.

5. The organic electroluminescent device according to claim 1, wherein an energy difference $\Delta E_L$ between the electron trapping dopant LUMO and the bipolar host LUMO is 0.15 eV or greater, and the electron trapping dopant has a content in the light-emitting layer of 0.1 mol. % to 30 mol. %.

6. The organic electroluminescent device according to claim 1, wherein the bipolar host is a fused non-heteropolycyclic aromatic compound which contains a pyrene skeleton.

7. The organic electroluminescent device according to claim 6, wherein the fused non-heteropolycyclic aromatic compound is represented by the following general formula (1),

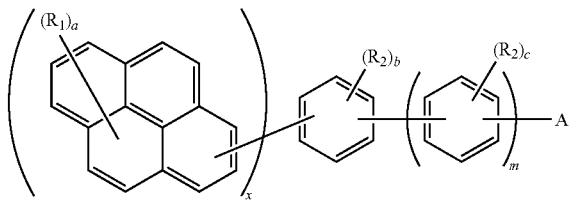

wherein $R_1$ and $R_2$ respectively represent a substituted or unsubstituted alkyl group or a substituted or unsubstituted aryl group; A represents a hydrogen atom, a substituted or unsubstituted alkyl group or a substituted or unsubstituted aryl group; x denotes an integer from 1 to 6; m denotes an integer from 0 to 10; a denotes an integer from 0 to 8; b denotes an integer from 0 to 4; c denotes an integer from 0 to 4; and when a is 2 or greater, each of the $R_1$s may be the same or different; and adjacent substituents may be linked together to form a ring, and when either of b or c is 2 or greater, each of the $R_2$s may each be the same or different; and adjacent substituents may be linked together to form a ring.

8. The organic electroluminescent device according to claim 1, wherein the electron trapping dopant contains a fluoranthene skeleton.

9. A display comprising pixels, wherein the pixels comprise the organic electroluminescent device according to any one of claims 1 to 8.

10. The display according to claim 9, which the pixels comprise pixels for emitting red and pixels for emitting green.

11. The display according to claim 9, wherein the pixels have a TFT.

12. The display according to claim 9, which has a top emission structure.

* * * * *